United States Patent
Ioffe et al.

(10) Patent No.: US 10,789,123 B2
(45) Date of Patent: Sep. 29, 2020

(54) FAULT TOLERANT CHARGE PARITY QUBIT

(71) Applicant: Wisconsin Alumni Research Foundation, Madison, WI (US)

(72) Inventors: Lev Ioffe, Middleton, WI (US); Lara Faoro, Middleton, WI (US); Robert Francis McDermott, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 16/387,931

(22) Filed: Apr. 18, 2019

(65) Prior Publication Data

US 2019/0324846 A1 Oct. 24, 2019

Related U.S. Application Data

(60) Provisional application No. 62/660,587, filed on Apr. 20, 2018.

(51) Int. Cl.
| | |
|---|---|
| *H03M 13/11* | (2006.01) |
| *H03M 13/00* | (2006.01) |
| *H04L 1/00* | (2006.01) |
| *G06F 11/10* | (2006.01) |
| *G06N 10/00* | (2019.01) |
| *H01L 39/02* | (2006.01) |

(52) U.S. Cl.
CPC ......... *G06F 11/1008* (2013.01); *G06N 10/00* (2019.01); *H01L 39/025* (2013.01)

(58) Field of Classification Search
CPC ..... G06F 11/1008; G06F 11/10; G06N 10/00; H01L 39/025
See application file for complete search history.

(56) References Cited

U.S. PATENT DOCUMENTS

| | | |
|---|---|---|
| 8,654,578 B2 | 2/2014 | Lewis et al. |
| 8,922,239 B2 | 12/2014 | Pesetski et al. |
| 2009/0057652 A1* | 3/2009 | Nevirkovets ......... H01L 39/223 257/35 |
| 2009/0078931 A1* | 3/2009 | Berkley ................. G06N 10/00 257/31 |
| 2017/0193388 A1 | 7/2017 | Filipp et al. |

OTHER PUBLICATIONS

P. Groszkowski, A. D. Paolo, A. L. Grimsmo, A. Blais, D. I. Schuster, A. A. Houck, and J. Kock, arXiv:1708.02886v1 "Coherence properties of the 0-π qubit"; Aug. 9, 2017—(21) pages.

(Continued)

*Primary Examiner* — Guy J Lamarre
(74) *Attorney, Agent, or Firm* — Boyle Fredrickson, S.C.

(57) ABSTRACT

A quantum computer architecture employs logical qubits that are constructed from a concatenation of doubly periodic Josephson junction circuits. The series concatenation of the doubly periodic Josephson junction circuits provides exponential robustness against local noise. It is possible to perform discrete Clifford group rotations and entangling operations on the logical qubits without leaving the protected state.

19 Claims, 2 Drawing Sheets

(56) References Cited

OTHER PUBLICATIONS

Jascha Ulrich et al.; "Simulation of supersymmetric quantum mechanics in a Cooper-pair box shunted by a Josephson rhombus." Physical Review B 92, No. 24, pp. 1-6 (dated Nov. 2015): Germany.
Yoneda et al. "A quantum-dot spin qubit with coherence limited by charge noise and fidelity higher than 99.9%." Nature nanotechnology 13, No. 2 (2018): pp. 102-106
International Search Report dated Aug. 6, 2019 for PCT/US2019/028230 (filed Apr. 19, 2019).

* cited by examiner

FAULT TOLERANT CHARGE PARITY QUBIT

CROSS REFERENCE TO RELATED APPLICATION

This application claims the benefit of U.S. provisional application 62/660,587 filed Apr. 20, 2018 hereby incorporated by reference in its entirety.

STATEMENT REGARDING FEDERALLY SPONSORED RESEARCH OR DEVELOPMENT

--

BACKGROUND OF THE INVENTION

The present invention relates to quantum computer architecture and in particular to an improved qubit circuit design that is more robust against state decoherence.

Quantum computers are a type of computer architecture in which classical computer "bits," having values of zero or one, are replaced with "qubits" exhibiting a quantum superposition of the values of zero and one. Such computers are useful for a class of calculations that would be difficult or impossible on a standard digital computer.

A significant challenge to the construction of a quantum computer is "decoherence" of the qubits in which their states are degraded, for example, by external quantum, electrical and thermal noise. Such degradation represents a loss of information and can be addressed in part by the use of parity bits to detect and correct errors in the qubits. These redundancy techniques, however, require that the qubits have a threshold level of resistance to decoherence, otherwise redundancy becomes impractical.

A variety of different qubit designs have been investigated including generally so-called charge, flux, and phase type qubits. One type of qubit, the "0-π qubit" has been described employing two Josephson junctions arranged symmetrically on opposite legs of a bridge circuit termed a "plaquette." The remaining legs of the bridge, separating the Josephson junctions, are occupied by superinductors, for example, having a value more than 10 μH or more, as is necessary to provide sufficient robustness of the qubit against decoherence. These superinductors are difficult to fabricate and carry with them a host of problems including self-resonances that could ultimately prevent practical adoption of a 0-π qubit of this design.

SUMMARY OF THE INVENTION

The present invention provides a "composite" qubit formed of multiple connected doubly periodic Josephson circuits operating as a logical unity and together providing improved resistance against decoherence while using only modest inductor sizes less than one μH and typically on the order of 1 to 10 nH. The resulting composite qubit is thus more practically fabricated while providing workable decoherence resistance.

In one embodiment, the invention provides a quantum computer including a set of qubits and qubit control circuitry for independently performing discrete operations on each qubit and independently reading qubit values from each qubit. Each qubit is a concatenation of at least two doubly periodic Josephson junction circuits each having an energy E being a function of a phase $\varphi$ such that $E(\varphi)=E(\varphi+\pi)$ where $\varphi$ is the superconducting phase difference across each individual doubly periodic Josephson junction circuit.

It is thus a feature of at least one embodiment of the invention to improve the resistance of a qubit to decoherence by concatenating doubly periodic Josephson junction circuits, a process which exponentially reduces the sensitivity of the qubit to external noise.

The concatenation may provide a series interconnection of doubly periodic Josephson junction circuits.

It is thus a feature of at least one embodiment of the invention to provide a simple method of combining doubly period circuits to improve decoherence resistance by simple electrical interconnection.

Each doubly periodic Josephson junction circuit may employ two Josephson junctions symmetrically arranged in a bridge circuit frustrated by a magnetic field.

It is thus a feature of at least one embodiment of the invention to provide a concatenated qubit employing a topology similar to a known and characterized doubly periodic Josephson junction circuit.

The bridge circuit may further include two inductors in series with and separating the two Josephson junctions and wherein the primary terminals are connections between a Josephson junction and an inductor. The inductors may have a value of less than 1 μH or even less than 100 nH.

It is thus a feature of at least one embodiment of the invention to provide a doubly periodic Josephson junction circuit having a greatly reduced inductor size improving its manufacturability and reducing multiple adverse effects of large inductor sizes including self-resonances.

The inductors may be fabricated from nanowires selected from the group consisting of disordered silicide or germanium alloys, nitride-based superconductors, and disordered aluminum.

It is thus a feature of at least one embodiment of the invention to provide the necessary resistance of the nanowires to produce a desired kinetic inductance.

The bridge circuit may further include a capacitor connected between and bisecting the bridge circuit at secondary terminals other than the primary terminals between Josephson junctions and inductors.

It is thus a feature of at least one embodiment of the invention to provide longer dephasing times for the qubit.

The concatenation may provide a series connection of doubly periodic Josephson junction circuits and further including an inductor controlled by the qubit control circuitry to switchably connect a superinductor in parallel with the end terminals of the qubit for performing discrete operations on the qubit.

It is thus a feature of at least one embodiment of the invention to provide Clifford group rotations of the concatenated qubit for performing operations on the qubit state. This superinductor may be moved off of the doubly periodic Josephson junction circuit simplifying manufacturability.

The superinductor may be constructed from a ladder of series-connected kinetic inductors with Josephson junctions in parallel with the series-connected inductor, with the cells of the ladder biased close to frustration.

It is thus a feature of at least one embodiment of the invention to provide a compact kinetic inductance that can allow phase fluctuations in a large range.

The quantum computer may further include a capacitor controlled by the qubit control circuitry to switchably connect a capacitor in parallel with the end terminals of the qubit for performing discrete operations on the qubit.

It is thus a feature of at least one embodiment of the invention to provide a capacitance working in conjunction with the superinductor for performing discrete operations on the qubit.

The qubit control circuitry may further include qubit readout circuitry for independently reading a value from each of the qubits.

It is thus a feature of at least one embodiment of the invention to permit treating the concatenated doubly periodic Josephson junction circuit as cohesive logical entities.

The quantum computer may further include qubit control leads communicating with the qubit control circuitry to individually move the doubly periodic Josephson junction circuits between a protected state and an unprotected state, wherein the unprotected state is less resistant to decoherence than the protected state.

It is thus a feature of at least one embodiment of the invention to permit the qubit to be readily switched between a protected and unprotected state for different requirements of performing operations on the qubit and readout of the qubit.

In one embodiment, the invention may provide a quantum computer having a set of doubly periodic qubits each having an energy E being a function of a phase $\varphi$ such that $E(\varphi)=E(\varphi+\pi)$ where $\varphi$ is the superconducting phase difference across a given doubly periodic qubit. A qubit control circuitry may control each qubit using an inductor controlled by the qubit control circuitry to switchably connect a superinductor in parallel with terminals of each doubly periodic qubit for control of the doubly periodic qubits; and a capacitor controlled by the qubit control circuitry to switchably connect a capacitor in parallel with the terminals each doubly periodic qubit for control of the doubly periodic qubits.

It is thus a feature of at least one embodiment of the invention to provide an improved circuit for controlling doubly periodic qubits.

These particular objects and advantages may apply to only some embodiments falling within the claims and thus do not define the scope of the invention.

DETAILED DESCRIPTION OF THE PREFERRED EMBODIMENT

Figure 1:
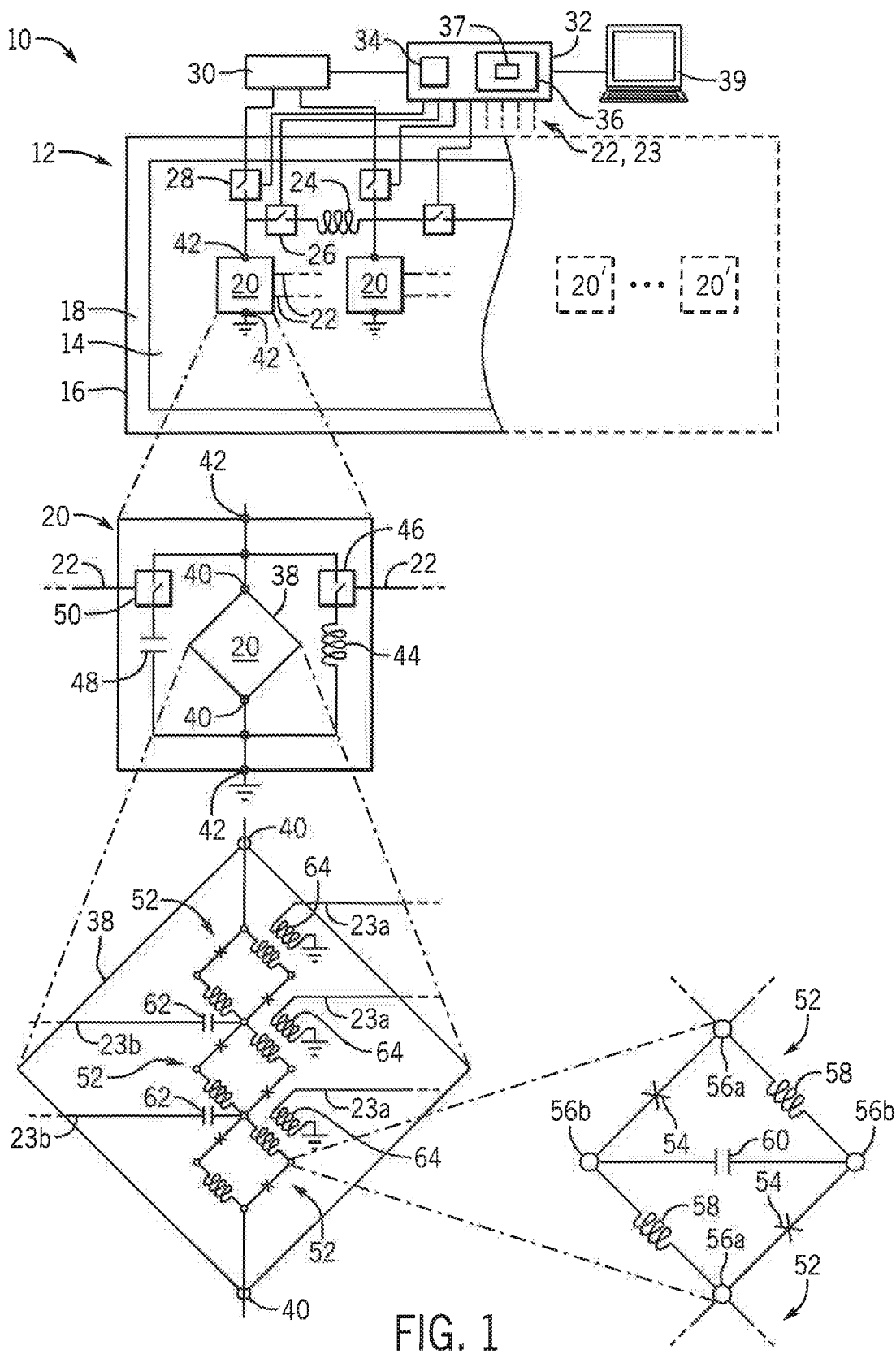
FIG. 1 is a set of nested block diagrams of decreasing scale showing the functional elements of an embodiment of a quantum computer using the qubits of the present invention controlled by a control circuit and further showing circuitry associated with each qubit for performing operations on the qubit and the construction of each qubit from multiple doubly periodic Josephson junction circuits.

Referring now to FIG. 1, a quantum computer 10 may provide a quantum subsystem 12 held within a controlled environment 14, for example, as shielded from outside electrical and thermal noise by a Faraday cage 16 and thermal insulation 18 or the like and being operated at a superconducting temperature range provided by refrigeration equipment (not shown for clarity). Generally, the circuitry within the controlled environment 14 will operate in the superconducting regime.

The quantum subsystem 12 will generally provide multiple qubits 20 employed for calculation, Optionally, and not believed to be necessary in the preferred embodiment, some qubits 20' are reserved for parity operations providing error correction of a type generally understood in the art. Each of the qubits 20 may receive control signals over qubit operation control lines 22, as will be discussed below, for performing discrete operations on the qubits 20.

Adjacent qubits 20 may be switchably interconnected, for example, through superinductor 24 connected between qubits 20 by a pulsed superconducting quantum interference device (SQUID) switch 26. This interconnection provides for entanglement between qubits 20 or other qubit operations generally understood in the art.

When the value of the qubits 20 needs to be interrogated, they may be individually connected by switches 28 to readout circuitry 30 of conventional design (including phase and frequency measuring devices), the switch 28, for example, being any device switchably coupling between the qubit 20 and readout circuitry 30. For example, the switch 28 may be a microwave cavity that is tuned or detuned, and coupled or not coupled with the qubit 20.

A qubit controller 32 receives readout information from the readout circuitry 30, provides control signals applying discrete operations to the qubits 20, optionally implements error correction, and provides outputs to an interface device 39 (for example, a computer keyboard and monitor). The interface device 39 also allows the qubit controller 32 to receive programming information for a particular problem to be solved. During operation of the quantum computer 10, the qubit controller 32 provides signals for controlling switches 28, 26 and for providing instruction signals over qubit operation control lines 22 and protection signals over qubit state control lines 23 as will be discussed below. The qubit controller 32 may be discrete logic or a computer providing for a processor 34 and a memory 36 holding a stored program 37 executed by the processor 34 to perform a sequence of operations to control the qubits 20 as will be discussed below.

Referring still to FIG. 1, each qubit 20 may provide for a concatenated qubit assembly 38 having primary terminals 40 joined with respective output terminals 42 of the two-terminal qubit 20. These output terminals 40 may be connected in parallel to a tunable superinductor 44 in series with a normally open switch 46 so that the superinductor 44 may be switchably connected and disconnected in parallel to the terminals 40 by the qubit controller 32. In this regard, the switch 46, for example, may be a SQUID switch controlled by a signal from the qubit controller 32 as discussed above.

In addition, the terminals 40 of the concatenated qubit assembly 38 may be connected in parallel to a series combination of a capacitor 48 and a normally closed switch 50 so that the capacitor 48 may be connected in parallel to the terminals 40 and disconnected through qubit operation control lines 22 communicating with the qubit controller 32. Generally, switches 50 and 46 will be used to perform discrete Clifford group rotations when the concatenated qubit assembly 38 is in a protected state as will be discussed below.

Referring still to FIG. 1, the concatenated qubit assembly 38 is in turn comprised of two or more doubly periodic Josephson junction (DPJJ) circuits 52 concatenated in series. The DPJJ circuits 52 can be characterized either by phase or by charge but will be generally treated as a phase device in this application where state information is characterized by superconducting phase. Construction of an example DPJJ circuit (providing a basis for the modifications described in the present application) is described in: "Physical implementation of protected qubits", by B Douçot and L B Ioffe, (28 Jun. 2012) IOP Publishing Ltd, Reports on Progress in Physics, Volume 75, Number 7hereby incorporated by reference. Generally, a DPJJ circuit 52 will have an energy E being a function of a phase φ such that $E(\varphi)=E(\varphi+\pi)$ where φ is the superconducting phase difference across a given doubly periodic Josephson junction circuit. This relationship (termed herein "doubly periodic") allows "storage" of a quantum state in phase. Each of the DPJJ circuits 52, individually, could thus provide storage of a quantum state albeit with less robustness against error then the concatenated qubit assembly 38.

Each of the DPJJ circuits 52 comprises a bridge connection of two Josephson junctions 54, each Josephson junction 54 having one arbitrarily designated primary terminal 56a and one secondary terminal 56b. Pairs of terminals, each comprised of one primary terminal 56a and one secondary terminal 56b, are joined by an inductor 58 to complete the bridge. These inductors 58 are kinetic inductors (where inductance is a result of charge carrier momentum in contrast to a magnetic field) and may each have an inductance value of less than 1 µH, typically less than 100 nH, and generally contemplated to have values in the range of 1 to 10 nH. It is contemplated that the inductors 58 will have a self-capacitance of less than 1000 aF (ideally less than 200 aF) corresponding to a self-resonant frequency in excess of 100 gigahertz beyond the frequency scale relevant to the qubit operation. Optional capacitor 60 may be placed joining secondary terminals 56b to provide for longer dephasing times.

The series connection of DPJJ circuits 52 is provided by connecting primary terminals 56a of adjacent DPJJ circuits 52 in a pairwise fashion leaving two primary terminals 56a unconnected and exposed at the end of the chain to provide the terminals 40 of the concatenated qubit assembly 38. Generally, the DPJJ circuits 52 provide no interaction with adjacent DPJJ circuits 52 except through the terminals 56a.

The shared terminals 56a of interconnected adjacent DPJJ circuits 52 may communicate through capacitors 62 with the qubit controller 32. These capacitors 62 are used (like field coils 64 discussed below) to control the environment of the DPJJ circuits 52, but in this case by controlling charge at the shared terminals 56a and thereby operating in conjunction with field coils 64 to tune the DPJJ circuit 52 to produce a "frustrated" state.

Generally, each DPJJ circuit 52 in isolation can operate to store a qubit value, being a superposition of states representing a logical zero and a logical one. When concatenated, the DPJJ circuits 52 also store a qubit value being a superposition of states representing a logical zero and a logical one but with improved resistance to decoherence. Thus, no additional data capacity is provided but improved state separation is created that resists decoherence. In this concatenated state, the individual states of the DPJJ circuits 52 are no longer individually measured.

As noted above, each concatenated qubit assembly 38 may receive qubit state control lines 23 from the qubit controller 32 controlling the immediate environment of the given DPJJ circuit 52 to move DPJJ circuit 52 between an unprotected state where it is susceptible to noise (including but not limited to thermal noise and quantum noise) and quickly decoheres and a protected state where the DPJJ circuit 52 is resistant to (protected from) noise. This transition between protected and unprotected states is accomplished by tuning the DPJJ circuit 52 into frustration and nulling offset charges at the primary terminals such as to provide more separation of the superimposed states better resistant to noise. In one embodiment, the qubit state control lines 23a communicate with field coils 64 used for independently adjusting the environment of the DPJJ circuits 52 by biasing the flux through the bridge and further communicate with coupling capacitor 64 adjusting the environment of the DPJJ circuit 52 by controlling the charge at the shared terminals 56a. The qubit state control lines 23a and 23b are set to empirically derived values to tune the DPJJ circuit 52 to produce a "frustrated" state.

Figure 2:
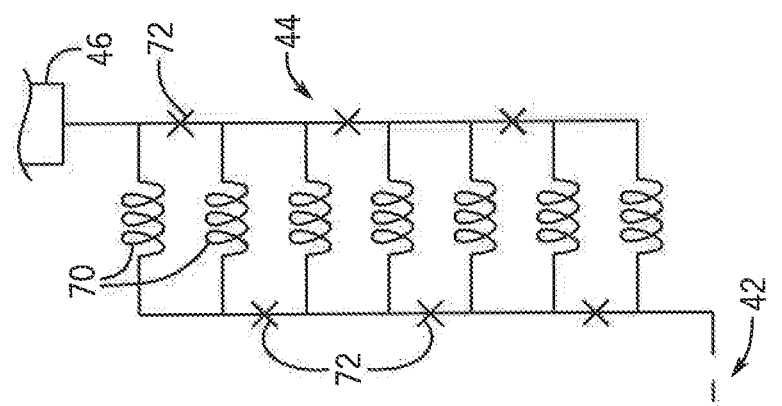
FIG. 2 is a detailed schematic of a superinductor being part of the circuitry of FIG. 1 for performing operations on the qubit.

Referring now to FIGS. 1 and 2, the superinductor 44 of FIG. 1 used for performing discrete operations on the concatenated qubit assembly 38 may be formed using a ladder of kinetic inductive elements 70 with bridging Josephson junctions 72. For example, the inductive elements 70 may be arranged in series and the Josephson junction may be connected to spanning pairs of series-connected inductors 70. These inductive elements 70 may be formed from strongly disordered superconductors to suppress phase slips across the array.

A similar design approach may be used for the construction of superinductor 24, and similar materials may be used for the construction of inductors 58. The necessary resistance of the inductive elements 70 (and superinductor 24 and inductors 58) such as promotes a regime of kinetic inductance is provided by employing a material that operates close to the superconductor-to-insulator transition. Candidate materials include disordered silicide or germanium alloys, nitrate-based superconductors such as NbN, TiN, and NbTiN, and disordered or dirty aluminum, being aluminum sputtered in the presence of a significant partial pressure of oxygen.

Figure 3:
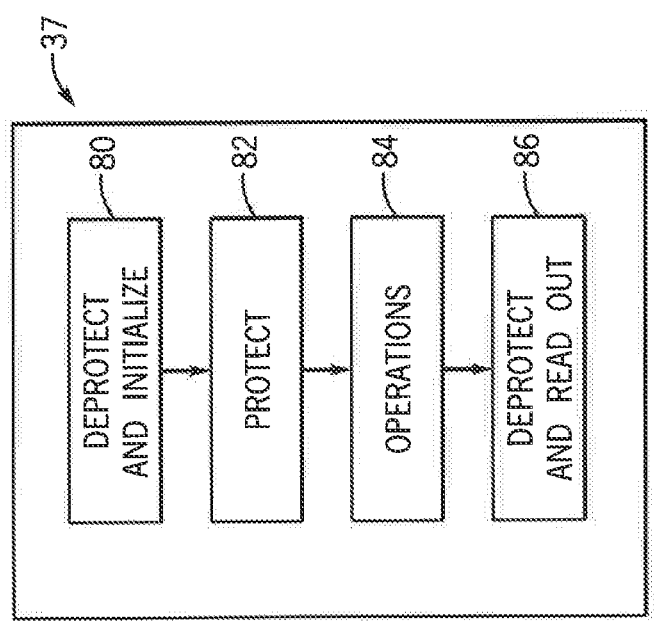
FIG. 3 is a flowchart showing the principal steps of operating on the qubits under the control of the control circuit of FIG. 1.

Referring now to FIGS. 1 and 3, the program 37 in the memory 36 may provide control of the qubits 20 according to a sequence beginning as indicated by process block 80 in which the qubit state control lines 23 are activated for each of the DPJJ circuits 52 to move the DPJJ circuits 52 into a unprotected mode so that decoherence is accelerated to move the DPJJ circuits 52 to a ground state thus initializing the DPJJ circuits 52. As indicated by process block 82, the qubit controller 32 may then move the qubits 20 into a protected state by controlling the qubit state control lines 23a and 23b.

At process block 84 switches 46 and 50 are controlled by the qubit controller 32 to provide for Clifford transformation of the qubit states. The values of these manipulations depend on the program being implemented and represent operations to be performed on the quantum state data. Operation of the switch 46 and switch 50 can be understood to perform orthogonal rotations of the qubit data in the space of a Bloch sphere.

Also, at process block 84, the values of the qubits in adjacent DPJJ circuits 52 may be entangled through superinductor 24 to realize a controlled phase gate operation.

At the conclusion of the quantum calculation, as indicated by process block 86, the DPJJ circuits 52 may be again moved to an unprotected state and their values measured, for example, by coupling to readout circuitry 30 for readout of values such as causes a collapse of superposition into an actual set of values.

Certain terminology is used herein for purposes of reference only, and thus is not intended to be limiting. Per convention, the term "qubit" refers both to a value represented by superposition and to a device for storing that value as will be evident from context. The term "circuit" is used generally to indicate one or more electrical elements having at least two terminals is not intended to be limited to the use of discrete electrical devices. The terms "superinductor" and "inductor are used in the application for clarity they should be recognized that a superinductor is also an inductor. Terms such as "upper", "lower", "above", and "below" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features of the present disclosure and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

References to "a microprocessor" and "a processor" or "the microprocessor" and "the processor," can be understood to include one or more microprocessors that can communicate in a stand-alone and/or a distributed environment(s), and can thus be configured to communicate via wired or wireless communications with other processors, where such one or more processor can be configured to operate on one or more processor-controlled devices that can be similar or different devices. Furthermore, references to memory, unless otherwise specified, can include one or more processor-readable and accessible memory elements and/or components that can be internal to the processor-controlled device, external to the processor-controlled device, and can be accessed via a wired or wireless network.

It is specifically intended that the present invention not be limited to the embodiments and illustrations contained herein and the claims should be understood to include modified forms of those embodiments including portions of the embodiments and combinations of elements of different embodiments as come within the scope of the following claims. All of the publications described herein, including patents and non-patent publications, are hereby incorporated herein by reference in their entireties.

What we claim is:

1. A quantum computer comprising:
   a set of qubits; and
   qubit control circuitry for independently performing discrete operations on each qubit and independently reading a qubit value from each qubit;
   wherein each qubit is a concatenation of at least two doubly periodic Josephson junction circuits each having an energy E being a function of a phase $\varphi$ such that $E(\varphi)=E(\varphi+\pi)$ where $\varphi$ is the superconducting phase difference across a given doubly periodic Josephson junction circuit.

2. The quantum computer of claim 1 wherein the concatenation provides a series interconnection of doubly periodic Josephson junction circuits.

3. The quantum computer of claim 2 wherein the doubly periodic Josephson junction circuits include two Josephson junctions symmetrically arranged in a bridge circuit, wherein the doubly periodic Josephson junction circuits are connected in series at primary terminals of the doubly periodic Josephson junction circuits on opposite sides of the bridge.

4. The quantum computer of claim 3 wherein the bridge circuit further includes two inductors in series with and separating two Josephson junctions, each Josephson junction being connected to a different primary terminal forming a connection between an inductor and a Josephson junction.

5. The quantum computer of claim 4 wherein the inductors have a value of less than 1 μH.

6. The quantum computer of claim 5 wherein the inductors have a value of less than 100 nH.

7. The quantum computer of claim 4 wherein the inductors are fabricated from nanowires selected from the group consisting of disordered silicide alloys, germanium alloys, nitride-based superconductors, and disordered aluminum.

8. The quantum computer of claim 4 wherein the bridge circuit further includes a capacitor connected between and bisecting the bridge circuit at secondary terminals other than the primary terminals between Josephson junctions and inductors.

9. The quantum computer of claim 3 wherein the concatenation provides a series connection of doubly periodic Josephson junction circuits between two end terminals of the doubly periodic Josephson junction circuits being primary terminals not connected to adjacent doubly periodic Josephson junction circuits of the qubit and further including a inductor controlled by the qubit control circuitry to switchably connect a superinductor in parallel with the end terminals of the qubit for performing discrete operations on the qubit.

10. The quantum computer of claim 9 wherein the inductor is constructed from a ladder of series-connected kinetic inductors with Josephson junctions in parallel with series-connected inductors.

11. The quantum computer of claim 9 further including a capacitor controlled by the qubit control circuitry to switchably connect a capacitor in parallel with the end terminals of the qubit for performing discrete operations on the qubit.

12. The quantum computer of claim 1 wherein the qubit control circuitry further includes qubit readout circuitry for independently reading a value from each of the qubits.

13. The quantum computer of claim 1 further including switchable connections between the qubits for entangling the qubit states as controlled by the qubit control circuitry.

14. The quantum computer of claim 1 further including qubit control leads communicating with the qubit control circuitry to individually move the qubit circuits between a protected state and an unprotected state, wherein the unprotected state is less resistant to decoherence than the protected state.

15. The quantum computer of claim 1 wherein the qubit control leads are field windings in the proximity of each of the doubly periodic Josephson junction circuits controlled by the qubit control circuitry.

16. The quantum computer of claim 1 wherein the qubit control leads are capacitors connected to the primary terminals controlled by the qubit control circuitry.

17. The quantum computer of claim 1 wherein the qubit control circuitry controls some qubits to provide error correction for other qubits.

18. A quantum computer comprising:
- a set of doubly periodic qubits each having an energy E being a function of a phase φ such that $E(\varphi)=E(\varphi+\pi)$ where φ is the superconducting phase difference across a given doubly periodic Josephson junction circuit;
- qubit control circuitry;
- an inductor controlled by the qubit control circuitry to switchably connect an inductor in parallel with terminals of each doubly periodic qubit for control of the doubly periodic qubits; and
- a capacitor controlled by the qubit control circuitry to switchably connect a capacitor in parallel with the terminals of each doubly periodic qubit for control of the doubly periodic qubits.

19. The quantum computer of claim 18 wherein switching of the capacitor and of the inductor provide discrete orthogonal rotations in charge and phase basis of the doubly periodic qubits.

* * * * *